US009310951B2

(12) United States Patent
Bell et al.

(10) Patent No.: US 9,310,951 B2
(45) Date of Patent: Apr. 12, 2016

(54) CHARGE DISTRIBUTION

(71) Applicant: Synaptics Incorporated, San Jose, CA (US)

(72) Inventors: Marshall J Bell, Dripping Springs, TX (US); Jeffrey Small, Rochester, NY (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 14/527,711

(22) Filed: Oct. 29, 2014

(65) Prior Publication Data

US 2015/0049060 A1 Feb. 19, 2015

Related U.S. Application Data

(63) Continuation of application No. 13/890,054, filed on May 8, 2013, now Pat. No. 8,928,359.

(51) Int. Cl.

*H03K 17/955* (2006.01)
*G06F 3/044* (2006.01)
*G05F 3/26* (2006.01)

(52) U.S. Cl.

CPC ................ *G06F 3/044* (2013.01); *G05F 3/262* (2013.01); *H03K 17/955* (2013.01)

(58) Field of Classification Search

CPC ........ G05F 3/262; G06F 3/044; H03K 17/955
See application file for complete search history.

(56) References Cited

U.S. PATENT DOCUMENTS 6,031,366 A 2/2000 Mitsuishi
6,590,799 B1 7/2003 Rickes et al.
6,714,469 B2 3/2004 Rickes et al.
8,427,230 B2 4/2013 Shih et al.
8,648,624 B2 2/2014 Yamada
8,698,534 B1 4/2014 Huang et al.
8,928,359 B2 1/2015 Small et al.
2012/0019314 A1 1/2012 Shih et al.
2012/0092297 A1* 4/2012 Han ........................ G06F 3/044 345/174
2012/0280744 A1 11/2012 Hsieh
2013/0063395 A1 3/2013 Byun et al.

FOREIGN PATENT DOCUMENTS

WO 2010111668 A1 9/2010

OTHER PUBLICATIONS

ISA/EPO, Partial International Search for International Application # PCT/US2014/037097, pp. 1-6, mailed Oct. 9, 2014.

ISA/EP, International Search Report and Written Opinion for International Application # PCT/US2014/037097, pp. 1-16, mailed May 8, 2015.

* cited by examiner

*Primary Examiner* — Jeffrey Zweizig

(57) ABSTRACT

A processing system for an input device includes a receiver module and a charge distributor. The receiver module includes a first charge integrator coupled to a first sensor electrode and configured to integrate a charge on the first sensor electrode. The charge distributor includes a current conveyor and a plurality of output stages coupled to the current conveyor, wherein a first output stage of the plurality of output stages comprises a plurality of current mirrors and is configured to output a first scaled mirrored charge to offset the charge integrated by the first charge integrator, wherein the first scaled mirrored charge is based on a charge signal provided via the current conveyor.

20 Claims, 10 Drawing Sheets

CHARGE DISTRIBUTION

CROSS-REFERENCE TO RELATED APPLICATIONS (CONTINUATION)

This application claims priority to and is a continuation application of co-pending U.S. patent application Ser. No. 13/890,054, filed on May 8, 2013 entitled, "CHARGE DISTRIBUTION," by Marshall J Bell et al.

BACKGROUND

Many circuits, such as sampled data circuits, require or utilize accurate charges in the processing of sampled data. Charge sources are used to provide these accurate charges. Conventionally, at least one capacitor is used directly for each charge source. That is, if one charge source is needed at least one capacitor is charged up and then discharged as needed to directly provide the charge. Likewise, if n charge sources are needed (where n is 1 or greater than 1) at least n capacitors are used to provide the n charge sources. In some implementations, a single charge source may be composed of more than a single capacitor. For example, a bank of capacitors may be used in a manner that allows the bank to produce a selectable amount of charge to be provided directly, through discharge of the bank, to a circuit that requires the charge. When the number of charge sources is great, such as in an integrated circuit or electronic system that includes multiple sampled data circuits, the number of capacitors required to provide the charge sources can be quite large when it is considered that there is at least a one-to-one relationship between the number of capacitors and charge sources and often that ratio is greater than one capacitor per charge source. In many instances charge sources and data sampling circuits which utilize charge sources may be included in an input device that is used to receive user input.

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones and tablet computers). Such touch screen input devices are typically superimposed upon or otherwise collocated with a display of the electronic system.

SUMMARY

A charge distributor comprises a charge generator configured to output a charge, a current conveyor, and a plurality of output stages. The current conveyor is configured to receive the charge from the charge generator as an input and to couple this charge to a plurality of output stages. A first output stage, of the plurality of output stages, comprises a plurality of current mirrors. The plurality of current mirrors is configured to mirror and scale the charge received from the current conveyor into a scaled mirrored charge. The first output stage is configured to provide the scaled mirrored charge as an output.

In some embodiments the charge distributor is utilized to provide a mirrored or scaled and mirrored charge within an analog-to-digital convertor.

In some embodiments the charge distributor is utilized to provide a mirrored or scaled and mirrored charge within an input device.

BRIEF DESCRIPTION OF DRAWINGS

The drawings referred to in this Brief Description of Drawings should not be understood as being drawn to scale unless specifically noted. The accompanying drawings, which are incorporated in and form a part of the Description of Embodiments, illustrate various embodiments and, together with the Description of Embodiments, serve to explain principles discussed below, where like designations denote like elements.

DESCRIPTION OF EMBODIMENTS

Figure 1A:
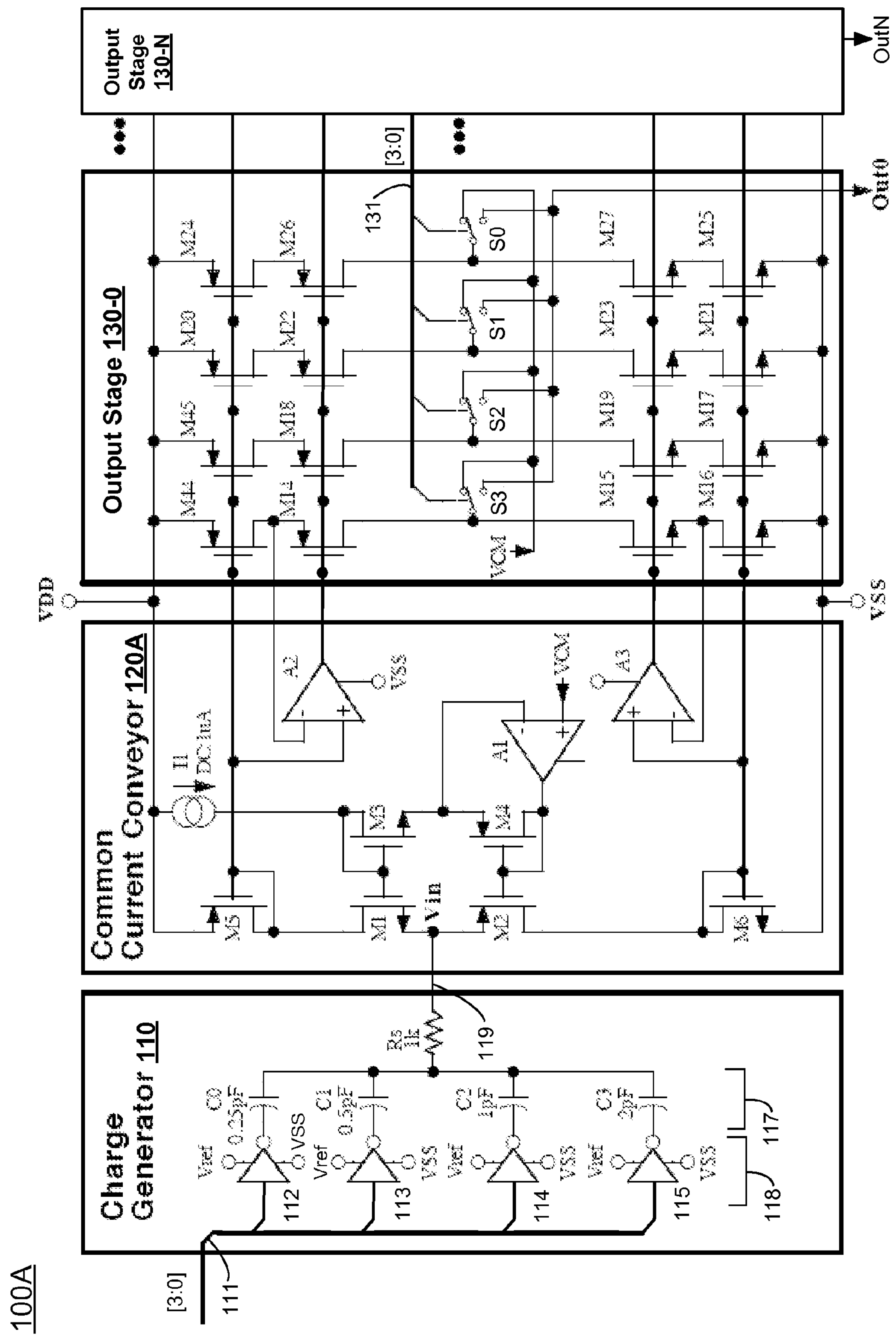
FIG. 1A illustrates a charge distributor, according to an embodiment.

The following Description of Embodiments is merely provided by way of example and not of limitation. Furthermore, there is no intention to be bound by any expressed or implied theory presented in the preceding Background, Summary, or Brief Description of Drawings or the following Description of Embodiments.

Overview of Discussion

Herein, various embodiments are described that provide charge distributors. Such charge distributors may be used to provide charge in a variety of applications, including but not limited to: analog-to-digital conversion, data sampling, input devices, processing systems, and integrated circuits.

Embodiments described herein disclose a manner of using a single charge generator to generate a charge which is mirrored to n output stages where the charge can be independently mirrored or mirrored and scaled for output to a circuit in need of a charge. In this manner a single capacitor or single bank of capacitors may be simultaneously utilized to provide any number of charge outputs, limited only by the number of output stages in which the charge, from the charge generator, is mirrored or mirrored and scaled into a charge output. This can drastically reduce the number of capacitors needed to produce a plurality of charge sources and charge outputs. For example, in a conventional implementation where a single charge generator includes a bank of four capacitors, and there is a one-to-one mapping of charge generators to charge sources, it would take ten charge generators and forty capacitors to provide ten independent and simultaneously available charge outputs. However, using techniques and circuits described herein, a single charge generator can be used to provide n charge outputs that are independent and simultaneously available. Thus, in this example and using techniques and circuits described herein, where the value of n is 1, a single charge generator and its four capacitors are required to generate a single charge output. Similarly, where the value of n is 10, a single charge generator and its four capacitors are required to generate 10 charge outputs (that is, the number of charge generators and capacitors used therein for charge generation does not change or increase even though the number of charge outputs has increased).

Discussion begins with a description of a circuit for an example charge distributor, and some example variations thereof are then described. An example analog-to-digital convertor which includes the charge distributor or utilizes charge(s) provided by the charge distributor is described. An example input device, within which various embodiments described herein may be implemented, is described. An example sensor electrode pattern is then described. This is followed by description of an example processing system and some components thereof. Some examples of input devices, processing systems, and/or data sampling circuits (such as charge integrators) which include the charge distributor or utilize charge(s) provided by the charge distributor are then described.

Example Charge Distributor

FIG. 1A illustrates a charge distributor 100A, according to various embodiments. As illustrated in FIG. 1A, charge distributor 100A includes one charge generator 110, one common current conveyor 120A, and a plurality of output stages 130 (e.g. 130-0 . . . 130-N).

Charge generator 110 is an input block where a reference charge 119 is generated and output. As depicted, charge generator 110 includes a bank 117 of four switched capacitors C0, C1, C2, and C3 and a bank 118 of four inverters 112-115 with one inverter coupled to each capacitor. The switched capacitors 117 generate an accurate charge by connecting selected capacitors to a known voltage, Vref, and discharging the selected capacitors into a virtual ground, Vin, through a peak current limiting resistor Rs.

For example, inverter 112 is coupled with a first side of C0, inverter 113 is coupled with the first side of C1, inverter 114 is coupled with a first side of C2, and inverter 115 is coupled with a first side of C3. The second side of each of C0-C3 is coupled to the first side of resistor Rs (illustrated as a 1 kilo ohm resistor, but may have other values and may be variable in some embodiments). This single resistor, Rs, replaces many copies of a resistor which would normally be used in each output stage if capacitors were used in each of the output stages 130. Each inverter, 112-115, is coupled with voltages Vref and VSS for its rail voltages and receives an alternating input signal, such as a square wave, from a select lines 111. One or more of capacitors C0-C3 is selectively charged by corresponding inverters 112-115 when a combination of the inverters is selected by signals on select lines 111, and a charge 119 is output and coupled to common current conveyor 120A via the second side of resistor Rs.

In the embodiment of FIG. 1A, capacitor C0 has a value of 0.25 pF, capacitor C1 has a value of 0.5 pF, capacitor C2 has a value of 1 pF, and capacitor C3 has a value of 2 pF. The values of capacitors C0-C3 are binary weighted. That is, C1 has a value that is twice the value of C0; C2 has a value that is twice the value of C1; and C3 has a value that is twice the value of C2. For example, in the binary weighting embodiment of FIG. 1A where an externally provided select signal to invertor 112 controls the least significant bit and invertor 115 controls the most significant bit, a control signal of 1111 supplied on select lines 111 would produce a charge 119 of 3.75 pF that is scaled 15 times the size of a charge 119 of 0.25 pF produced by a control signal of 0001 on select lines 111. In one embodiment, a processing system, control logic, or the like controls such variation by providing a control signal on select lines 111 to direct the settings of capacitors C0-C3. In other embodiments, the values and weights of capacitors C0-C3 may differ, and even the number of capacitors 117 used may differ. In other embodiments, different values may be assigned to the capacitors 117 in charge generator 110 while still maintaining such a binary weighting. In other embodiments, a binary weighting may not be employed. For example, in one embodiment capacitors C0-C3 could have the same value as one another.

Although charge generator 110 is illustrated as employing four capacitors to generate charge 119, the number of capacitors is illustrated by way of example and not of limitation, and it should be appreciated that a lesser or greater number of capacitors may be employed to generate the charge 119 which is coupled to common current conveyor 120A. For example, in some embodiments, charge generator 110 may have or utilize only a single capacitor to generate the charge 119 which is coupled to common current conveyor 120A; while in other embodiments charge generator 110 may include more than four capacitors (e.g., 5, 8, 10, or more capacitors) to generate the charge 119 which is coupled to common current conveyor 120A.

Common current conveyor 120A operates to receive a charge 119 injected at Vin from charge generator 110 as an input, and to couple the charge 119 to a plurality of output stages 130. For example, transistors M5 and M6 operate as bi-directional current mirror masters which mirror this charge to current mirror slave transistors in output stages 130. The implementation of common current conveyor 120A that is illustrated in FIG. 1A is provided by way of example and not of limitation. There are a number of ways to implement a current conveyor, which are known in the art, and many other implementations besides the depicted implementation may be utilized to convey charge 119 to output stages 130.

Common current conveyor 120A includes transistors M1, M2, M3, M4, M5, and M6, current source I1 (illustrated as 1 μA, but may have other values in other embodiments), and amplifiers A1, A2, and A3. In some embodiments, all of the transistors in common current conveyor 120A are metal oxide semiconductor field effect transistors (MOSFETs) (e.g., some combination of negative channel MOSFET (NMOS) or/or positive channel MOSFET (PMOS) transistors). For example, as illustrated M1, M3, and M6 are NMOS transistors and M2, M4, and M5 are PMOS transistors. It should be appreciated that in other embodiments, other types of transistors may be utilized, for example transistors M1-M6 may be replaced with bipolar junction transistors (BJT) with very little modification.

As depicted in in FIG. 1A, M1 and M2 are input followers which receive charge 119 injected on their respective sources. M3 and M4 are diode connected (drain connected to gate) and are used to bias the gates of M1 and M2 to the proper gate voltage to M1 and M2 respectively. The sources of M3 and M4 are connected to the negative input of amplifier A1. The drain of M3 is coupled its own gate and is also coupled with current source I1 which provides bias current. The drain of M4 is coupled with its own gate and is also coupled with the output of A1, and the positive input of A1 is connected with VCM (common mode voltage). M5 and M6 are current mirror masters which each provide a charge, in the form of a current from their respective gates, which is mirrored within output stages 130-0 to 130-N. The drain of M5 is coupled with the drain of M1 and is also diode connected to the gate of M5, while the source of M5 is coupled with VDD. The gate of M5 is also coupled to the positive input of amplifier A2. The drain of M6 is coupled with the drain of M2 and is also diode connected to the gate of M6, while the source of M6 is coupled with VSS. The gate of M6 is also coupled to the positive input of amplifier A3.

Amplifier A2 is a cascode voltage generator for cascode transistors M14, M18, M22, and M26 (all in output stage 130-0 and duplicated in other output stages 130), and has: its negative input coupled with the source of M14 and the drain of M44 (both in output stage 130-0 and duplicated in other output stages 130); its positive input coupled with the gate of M5; and its output is coupled with the gates of M14, M18, M22, and M26. Amplifier A3 is a cascode voltage generator for cascode transistors M15, M19, M23, and M27 (all in output stage 130-0 and duplicated in other output stages 130) and has its: its negative input coupled with the source of M15 and the drain of M16 (both in output stage 130-0 and duplicated in other output stages 130); its positive input coupled with the gate of M6; and its output coupled with the gates of M15, M19, M23, and M27.

Output stage 130-0 is a first output stage, of a plurality of output stages 130 (130-0 to 130-N). Output stage 130-0, in one embodiment, includes a number of current mirror slave transistors, a number of cascode transistors, and a number of switches, but does not include any capacitors for charge generation. In some embodiments, no output stage 130 includes any capacitors. Construction of a plurality of output stages without capacitors allows a single set of capacitors in charge generator 110 to suffice to produce a charge that is then mirrored or mirrored and scaled in output stages with transistors. As such, these output states do not use additional integrated circuit real estate to implement additional capacitors for producing charge. Transistors can be implemented in a very small amount of space in an integrated circuit in comparison with the amount of space in an integrated circuit required to implement the size of the capacitors which would be used in conventional embodiments. This allows a number of output charges to be produced in the manner described herein while using far less space in an integrated circuit than would be used in conventional charge source producing techniques. It should be appreciated that in other embodiments, other types of transistors may be utilized. For example, the illustrated MOSFETs in output state 130-0 may be replaced with BJTs with only minor modification.

Like the other output stages 130 (e.g., 130-N and any other output stages), output stage 130-0 includes a plurality of current mirror slaves (M44, M45, M20, M24 which are gate connected to current mirror master M5 and/or M16, M17, M21, and M25 which are gate coupled to current mirror master M6). The sources of M44, M45, M20, and M24 are connected to VDD, while the sources of M16, M17, M21, and M25 are connected with VSS. The current mirror slave transistors operate to mirror and scale charge, received from their respective current mirror master transistors, into a scaled mirrored charge, Out0 , which is provided as an output from output stage 130-0. The amount of scaling is controlled by the sizes of the individual current mirror slave transistors and which of the current mirror slave transistors that are coupled to Out0 through switches S0-S3. In one embodiment, the current mirror slave transistors are binary weighted with respect to one another. For example, in one embodiment, M24 and M25 are the same size as M5 and M6, M20 and M21 are twice the size of M24 and M25, M45 and M17 are twice the size of M20 and M21, and M44 and M16 are twice the size of M45 and M17. In a binary weighting setup where M44 is eight times the size of M24, sixteen different binary weightings (0, 1× . . . 15×) may be achieved with current mirror slaves M44, M45, M20, and M25. It is appreciated that other weighting schemes are possible, for example, in one embodiment, all of the current mirror slave transistors may be identically sized. In one embodiment, all of the current mirror salve transistors may be the same size as M5 and M6.

Output stage 130-0, like the other output stages 130 (e.g., 130-N and any other output stages), also includes a number of cascode transistors that improve the quality of the output. Cascode transistors M14, M18, M22, and M26 correspond respectively to and have their respective sources connected to the respective drains of current mirror slave transistors M44, M45, M20, and M26; while cascode transistors M15, M19, M23, and M27 correspond respectively to and have their respective sources connected to the respective drains of current mirror slave transistors M16, M17, M21, and M25. In one embodiment, the cascode transistors are binary weighted with respect to one another in the same manner as the binary weighting of their corresponding current mirror slave transistors. For example, in one embodiment M26 and M27 are the same size, M22 and M23 are twice the size of M26 and M27, M18 and M19 are twice the size of M22 and M23, and M14 and M15 are twice the size of M18 and M19. In such an embodiment, M5, M6, M24, M26, M27, and M25 may all be the same size as one another. It is appreciated that other weighting schemes are possible, for example, in one embodiment, all of the cascode transistors may be identically sized. In another embodiment, when current mirror slave transistors are weighted in some fashion besides a binary weighting, each cascode transistor may be weighted in the same manner (e.g., the same size as) as its corresponding current mirror slave transistor.

The implementation illustrated in output stage 130-0 is bidirectional, and thus outputs a bidirectional scaled mirrored charge. A unidirectional implementation would omit either the top half or bottom half of the illustrated transistors in output stage 130-0. That is, either PMOS transistors M14, M18, M22, M26, M44, M45, M20, and M24 could be omitted or NMOS transistors M15, M19, M23, M27, M16, M17, M21, and M25 could be omitted to create a unidirectional charge output at Out0. In implementing a unidirectional output stage 130, corresponding changes could also be made to common current conveyor 120A to eliminate superfluous portions which supply signals not needed by a unidirectional output stage 130.

It should be appreciated that a greater or lesser number of current mirror slave transistors may be employed, in various embodiments. For example, in a bidirectional embodiment, M24 and M25 and their corresponding cascode transistors M26 and M27 may be the only transistors employed, while in another embodiment, additional current mirror slave transistors and corresponding cascode transistors may be employed.

Switches S0, S1, S2, and 23 are used to select which current mirror slave transistors are coupled (through their respective cascode transistors) to Out0 and which are coupled to VCM where their output is essentially disposed. As depicted, switches S0-S3 are single pole double throw switches which have a common terminal connected with drains of cascode transistors and one pole which will couple those cascode transistor drains to VCM and another pole which will couple those cascode transistor drains to Out0. As depicted, the common terminal of S0 is coupled with the drains of M26 of M27; the common terminal of S1 is connected with the drains of M22 and M23; the common terminal of S2 is coupled with the drains of M18 and M19, and the common terminal of S3 is coupled with the drains of M14 and M15. In one embodiment where fewer weighted transistors (than depicted) are employed, fewer switches than depicted will be employed. Likewise, in one embodiment where a greater number of weighted transistors (than depicted) are employed, a greater number of switches than depicted with be employed.

In the depicted embodiment, signals on select lines 131 can be used to vary the positioning of each of switches S0-S3. As depicted, all of switches S0-S3 are in an "off position" where they couple received charges to VCM, and thus Out0 has no value and output stage 130-0 is effectively "off" with respect to any circuit coupled to Out0. Through use of select lines 131, one or more of switches S0-S3 can be repositioned so that the drains of their corresponding transistors are connected with Out0. In a binary weighting embodiment where S0 controls the least significant bit and S3 controls the most significant bit, a control signal of 1111 supplied on select lines 131 would produce a scaled mirrored charge at Out0 that is scaled 15 times the size of a charge produced by a control signal of 0001 on select lines 131. It should be noted that when all of the inverters in charge generator 110 are off or quiet, regardless of the settings of switches S0-S3, no charge is produced at Out0. As can be seen, by changing the control signal received as an input to switches S0-S3, the amount of scaled mirrored charge produced at Out0 may be varied with four-bits of variability. In one embodiment, a processing system, control logic, or the like controls such variation by providing a control signal on select lines 131 to direct the settings of switches S0-S3. It should be appreciated that the bits of scalability may be increased or decreased from what is depicted in the FIG. 1A by simple addition or subtraction of components associated with each bit of scalability, such that n-bits of scalability may be implemented (where n is a value of one or greater and represents the number of bits of scalability built into an output stage 130). Thus, while 4-bits of scalability are illustrated, the scalability could be limited to 1-bit, 2-bits, or 3-bits, or could be more than 4-bits, in various embodiments.

In some embodiments, the magnitude of a scaled mirrored charged produced at Out0 may be fixed. That is, switches S0-S3 may be non-adjustably positioned at the time of manufacture or by a preset non-adjustable control signal on select lines 131, or switches S0-S3 may be replaced by hardwired connections to Out0.

In one embodiment, output stage 130-N and any other output stages 130 are similarly configured and coupled with common current conveyor 120A. Select lines 131 or similar select lines may be coupled with the switches in the other output stages 130. In this manner, the other output stages 130 (besides 130-1) may simultaneously and independently produce scaled mirrored charges as outputs (e.g., OutN of output state 130-N); and these charges at the outputs of output stages 130 may be the same as the charge produced at Out0 , different from the charge produced at Out0 , or even set to zero while a non-zero charge is being produced at Out0 .

It is well understood that a variety of circuits, require charge sources as inputs. The charge sources can be used to provide feedback in a closed loop circuit, can be used to add charge, subtract charge, or offset charge. By way of example and not of limitation, some such circuits which include a charge distributor 100, the output stage of a charge distributor 100, or simply incorporate a charge output received from a charge distributor 100 are depicted and described in FIGS. 2A, 2B, 3, 5, 6, and 7.

It should be appreciated by one of skill in the art that there are any number of different circuits which may be used to implement a common current conveyor 120. One such circuit for a common current conveyor 120 is illustrated as common current conveyor 120A in FIG. 1A. Two other example implementations of common current conveyor 120 (120B and 120C) are illustrated in FIGS. 1B and 1C respectively.

Figure 1B:
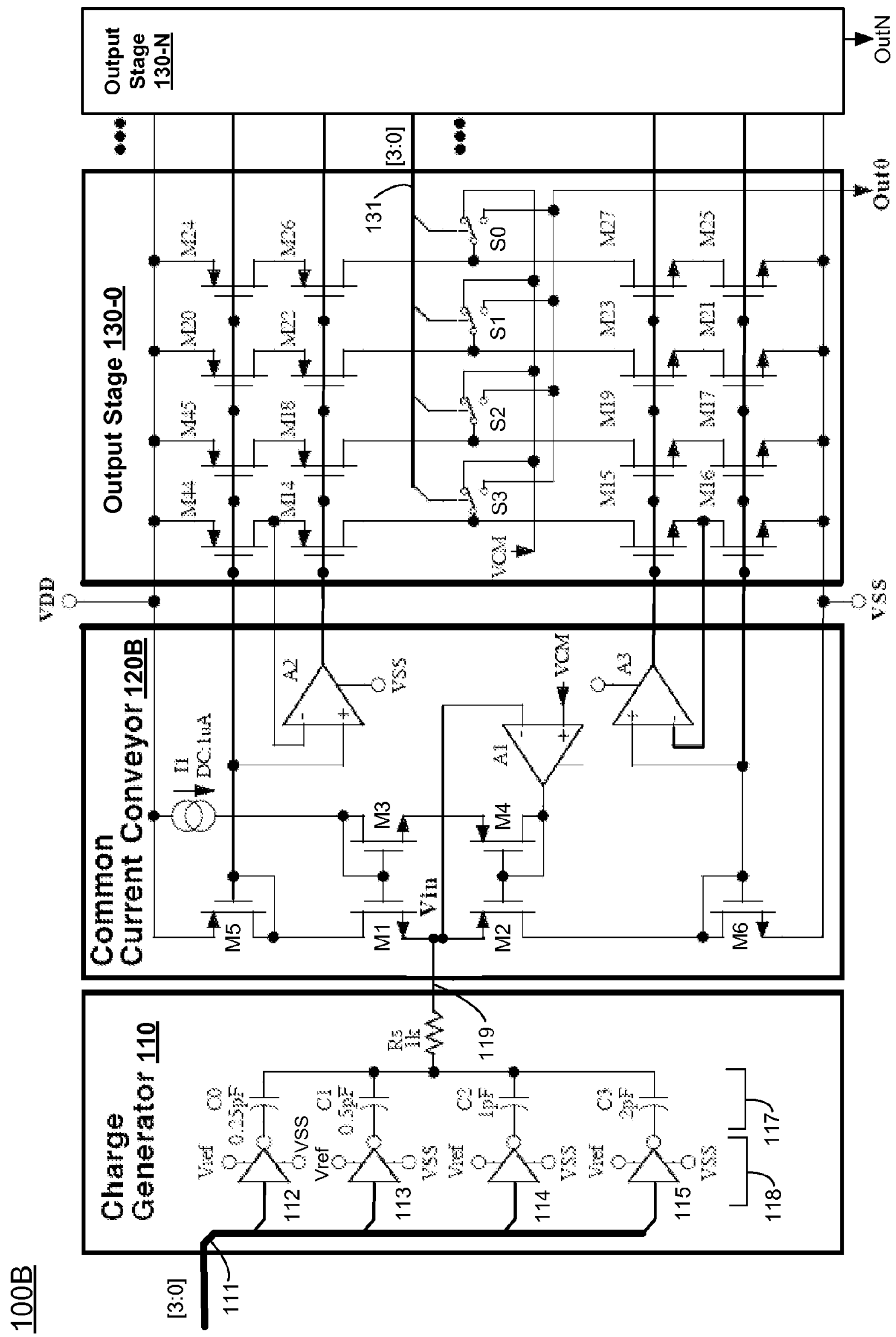
FIG. 1B illustrates a charge distributor, according to an embodiment.

FIG. 1B illustrates a charge distributor 100B, according to an embodiment. In FIG. 1B, charge generator 110 and output stages 130 (130-0 . . . 130-N) are identical to charge generator 110 and output stages 130 (130-0 . . . 130-N) of FIG. 1A. Common current conveyor 120B includes all of the same components and implements the same function as common current conveyor 120A. However, in common current conveyor 120B the sources of M3 and M4 are connected to one another but not to the negative input of amplifier A1 as in FIG. 1A; instead the negative input of amplifier A1 is coupled with the sources of M1 and M2. In this manner, charge 119 from charge generator 110 is coupled through resistor Rs as Vin on the sources of M1 and M2 and on the inverting input of amplifier A1.

Figure 1C:
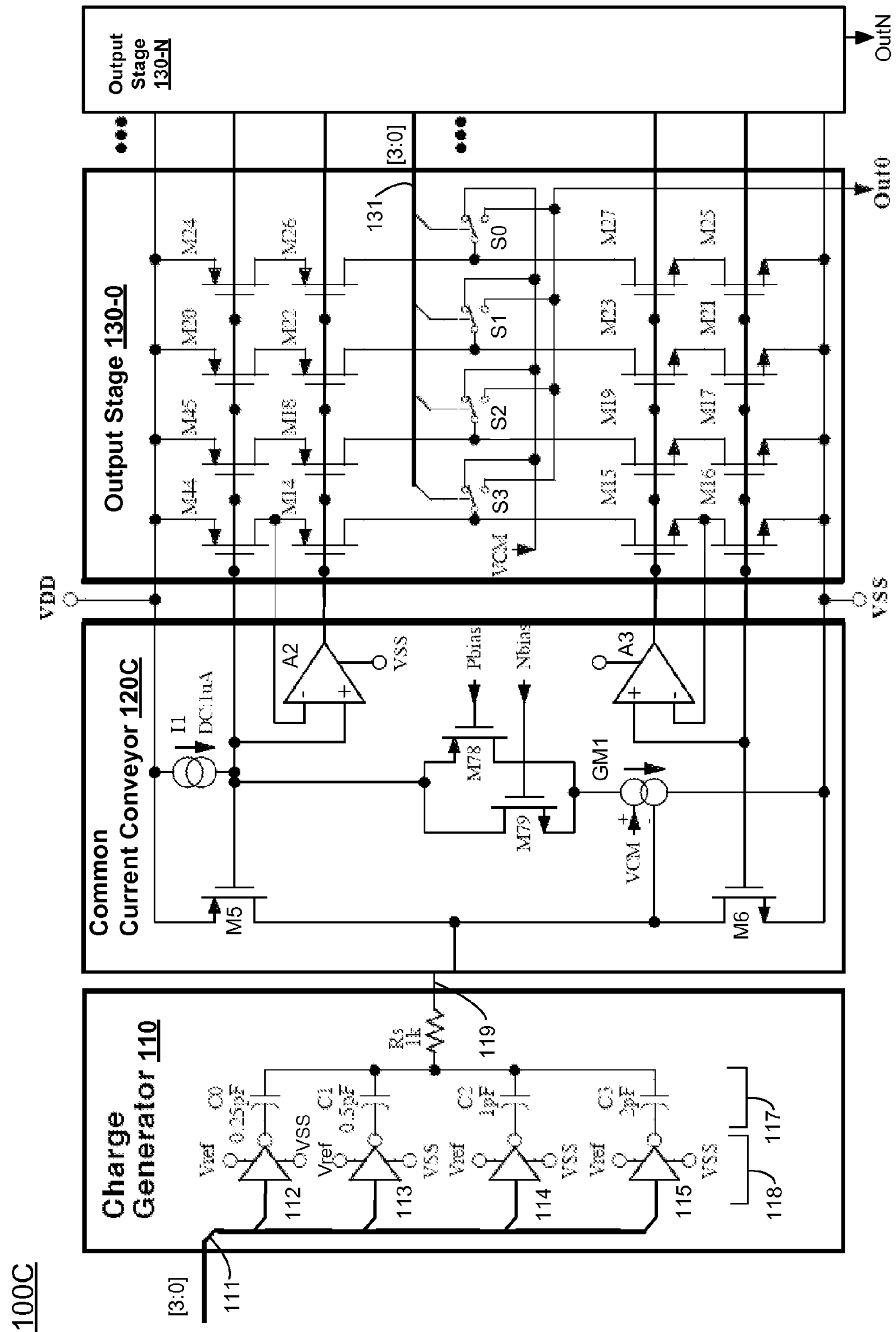
FIG. 1C illustrates a charge distributor, according to an embodiment.

FIG. 1C illustrates a charge distributor 100C, according to an embodiment. In FIG. 1C, charge generator 110 and output stages 130 (130-0 . . . 130-N) are identical to charge generator 110 and output stages 130 (130-0 . . . 130-N) of FIG. 1A. Common current conveyor 120C includes transistors M5, M6, M78, and M79, current source I1 (illustrated as 1 μA, but may have other values in other embodiments), amplifiers A2, and A3, and transconductance amplifier GM1. In some embodiments, all of the transistors in common current conveyor 120C are metal oxide semiconductor field effect transistors (MOSFETs) (e.g., some combination of negative channel MOSFET (NMOS) or/or positive channel MOSFET (PMOS) transistors). For example, as illustrated M6 and M79 are NMOS transistors and M5 and M78 are PMOS transistors. It should be appreciated that in other embodiments, other types of transistors may be utilized, for example transistors M5, M6, M78, and M79 may be replaced with bipolar junction transistors (BJT) with very little modification.

As depicted in in FIG. 1C, M5 and M6 receive charge 119 injected on their respective drains. Charge 119 is also provided on the negative voltage input of transconductance amplifier GM1, with VCM being provided on the positive voltage input of GM1. The source of M79 and the drain of M78 are coupled as inputs to GM1. A first side of current source I1 is coupled with VDD. The drain of M79 and the source of M78 are coupled with one another and with second side of current source I1, which provides bias current. The gate of M28 is biased with Pbias, while the gate of M79 is biased with Nbias. As in FIGS. 1A and 1B, M5 and M6 are current mirror masters which each provide a charge, in the form of a current from their respective gates, which is mirrored within output stages 130-0 to 130-N. The source of M5 is coupled with VDD. The gate of M5 is coupled with I1, the source of M27, the drain of M79, and the positive input of amplifier A2. The gate of M5 is also coupled as a current mirror master output to the gates of M44, M44, M20, and M24 of output stage 130-0 (and similarly to other output stages 130). The source of M6 is coupled with VSS and the output of GM1. The gate of M6 is coupled to the positive input of amplifier A3 and is also coupled as a current mirror master output to the gates of M16, M17, M21, and M25 of output stage 130-0 (and similarly to other output stages 130).

Amplifier A2 is a cascode voltage generator for cascode transistors M14, M18, M22, and M26 (all in output stage 130-0 and duplicated in other output stages 130), and has: its negative input coupled with the source of M14 and the drain of M44 (both in output stage 130-0 and duplicated in other output stages 130); its positive input coupled with the gate of M5; and its output is coupled with the gates of M14, M18, M22, and M26. Amplifier A3 is a cascode voltage generator for cascode transistors M15, M19, M23, and M27 (all in output stage 130-0 and duplicated in other output stages 130) and has its: its negative input coupled with the source of M15 and the drain of M16 (both in output stage 130-0 and duplicated in other output stages 130); its positive input coupled with the gate of M6; and its output coupled with the gates of M15, M19, M23, and M27.

Example Use in Analog-to-Digital Conversion

Figure 2A:
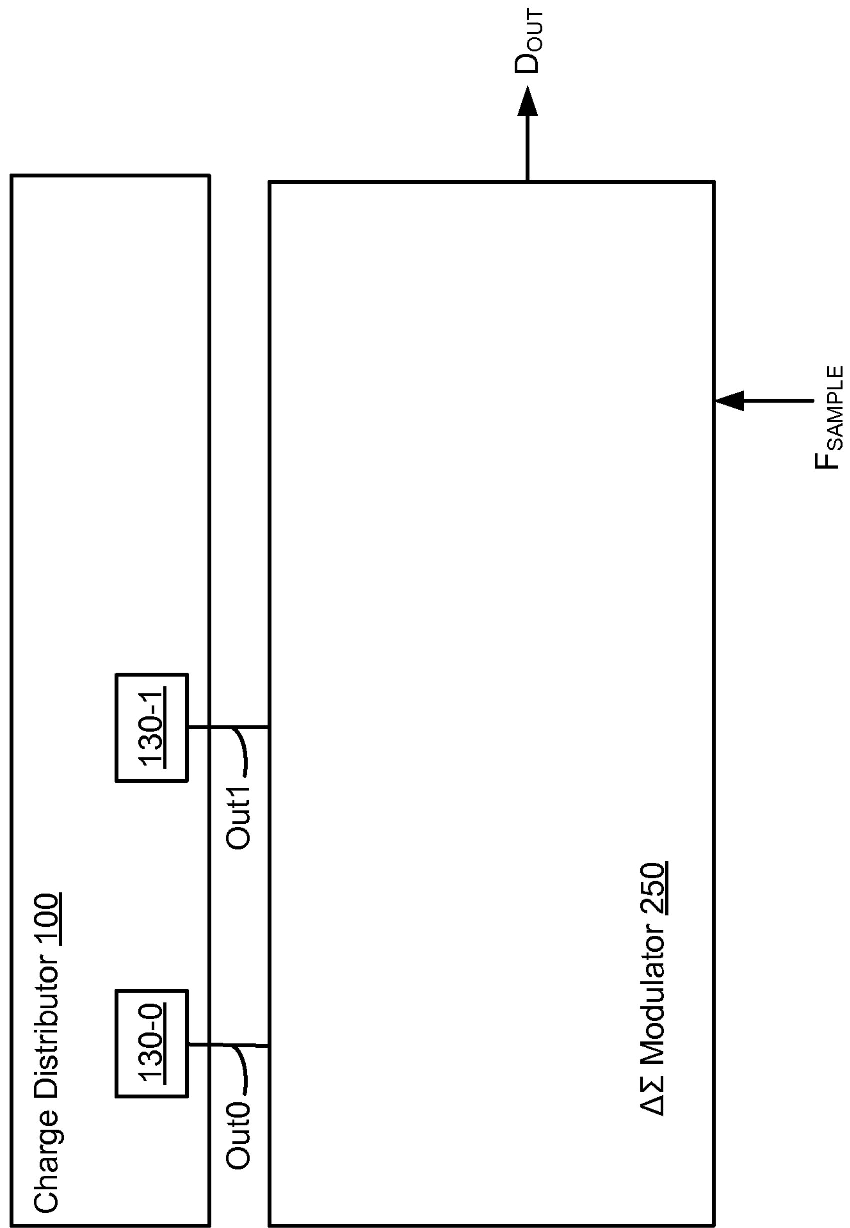
FIG. 2A illustrates an analog-to-digital convertor, according to various embodiments.

FIG. 2A illustrates an analog-to-digital convertor 200, according to various embodiments. Analog-to-digital convertor 200 includes a delta sigma modulator 250 and a charge distributor 100. It should be appreciated that a myriad of designs and variations exist for a delta sigma modulator 250. In general, though, a delta sigma modulator 250 receives an analog sample, Fsmpl, as an input and converts it to a digital output while. Additionally, a delta sigma modulator 250 requires multiple charge transfers for which are conventionally provided by capacitors. However, using the technology described herein, one or more outputs 130 of charge distributor 100 are utilized to provide charge transfers into delta sigma modulator 250 (see Out0 and Out1 which represent charges transferred from output 130-0 and output 130-1 respectively). Although only two charges are shown as being transferred from charge distributor 100 into delta sigma modulator 250, it should be appreciated that in some embodiments a single charge may be transferred or more than three charges may be transferred. Such charges that are transferred into delta sigma modulator 250 from charge distributor 100 eliminate the need for the multiplicity of capacitors that are independently necessary to conventionally produce each transferred charge, and instead charge distributor 100 can utilize a single shared set of capacitors and then mirror and/or mirror and scale charges as needed to produce a plurality of charge outputs without using more capacitors to produce a plurality of charge outputs.

Figure 2B:
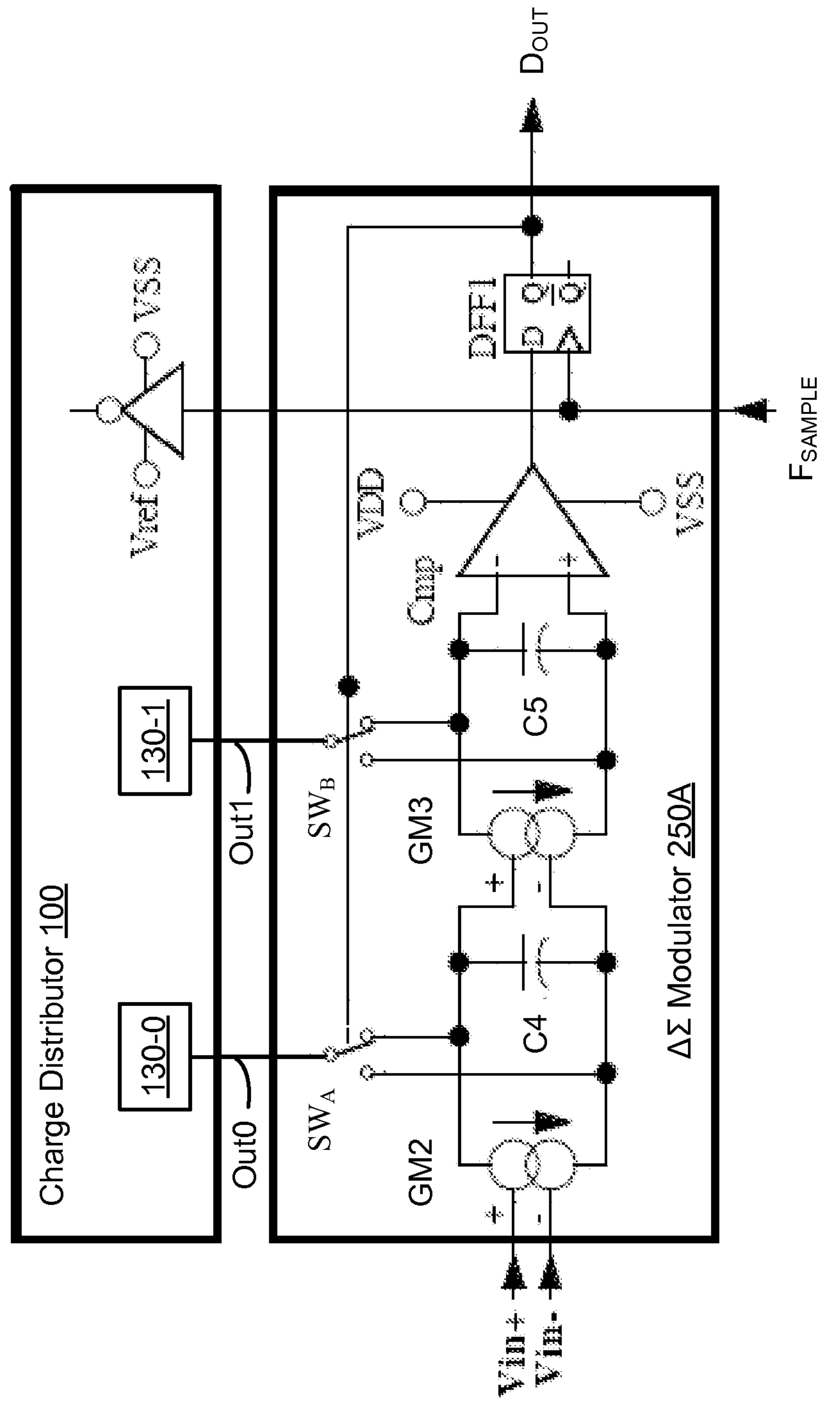
FIG. 2B illustrates an analog-to-digital convertor, according to an embodiment.

FIG. 2B illustrates an analog-to-digital convertor 200A, according to an embodiment. Analog-to-digital convertor 200A includes a delta sigma modulator 250A and a charge distributor 100. It should be appreciated that the illustrated design of delta sigma modulator 250A is provided by way of example and not of limitation, and that many designs and variations exist which receive transferred charges as inputs. Delta sigma modulator 250A receives an analog sample, Fsmpl, as an input and converts it to a digital output, Dout, as quantized by the clocked Q output of D-flip-flop DFF1. Fsmpl is used to drive an inverter such that a charge is produced and then mirrored as Out0 from output stage 130-0 and Out1 at output stage 130-1 of charge distributor 100. Such charges are transferred into delta sigma modulator 250A and eliminate the need for the multiplicity of capacitors that are independently necessary to conventionally produce each transferred charge. Fsmpl also drives the clock input of DFF1. CMP is a differential amplifier used as a comparator to compare the input sample, Fsmpl, with various values and to output a signal to the data line of DFF1 each time a comparison finds that Fsmpl is greater than the compared value. CMP is coupled with rail voltages of VDD and VSS. A pair of transconductance amplifiers GM2 and GM3 utilize positive and negative input voltages (Vin+ and Vin−). GM2 and GM3 are coupled with the inverting and non-inverting inputs of Cmp as are capacitors C4 and C5. Charges Out0 and Out1 are coupled as inputs to delta sigma modulator 250A. Switch $SW_A$ controls which side of capacitor C4 to which charge Out0 is transferred, while switch $SW_B$ controls which side of capacitor C5 to which charge Out1 is transferred.

Example Input Device

Figure 3:
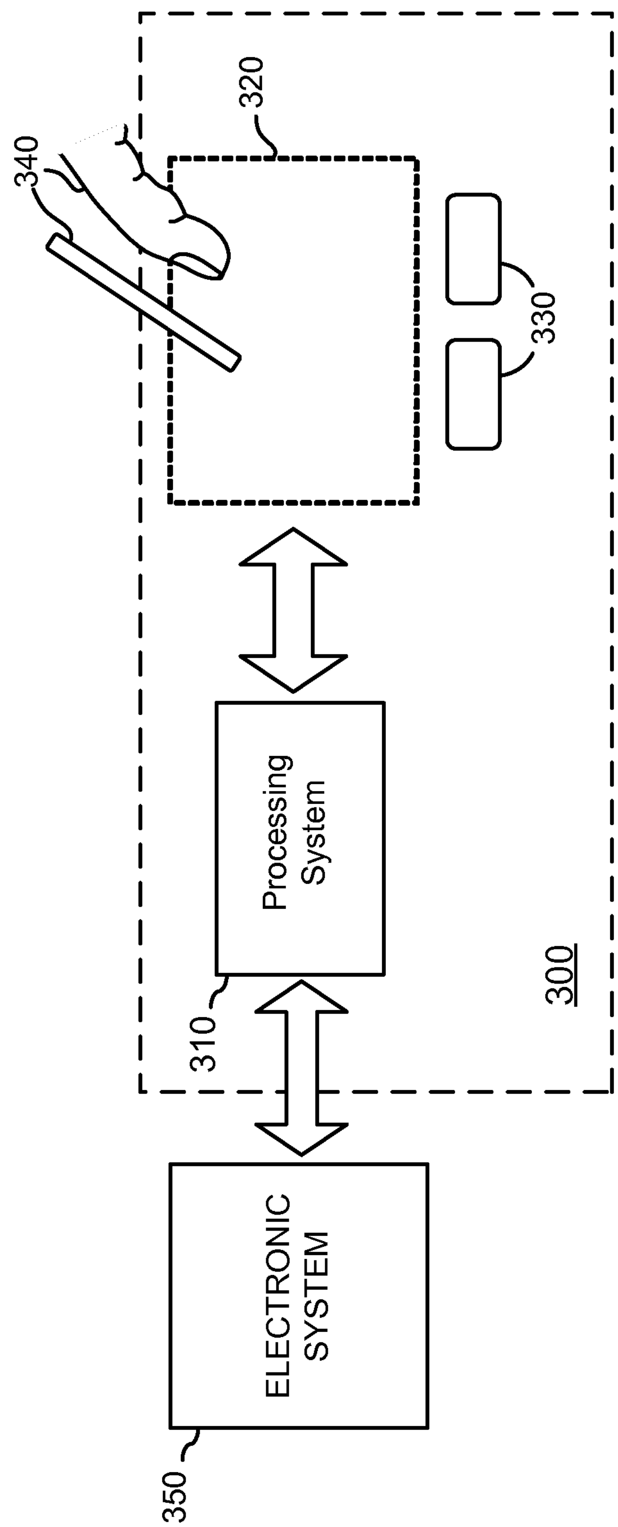
FIG. 3 is a block diagram of an example input device, in accordance with embodiments.

FIG. 3 is a block diagram of an exemplary input device 300, in accordance with various embodiments. Input device 300 may be configured to provide input to an electronic system/device 350. As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 300 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic systems could be a host or a slave to the input device.

Input device 300 can be implemented as a physical part of an electronic system 350, or can be physically separate from electronic system 350. As appropriate, input device 300 may communicate with parts of the electronic system using any one or more of the following: buses, networks, and other wired or wireless interconnections. Examples include, but are not limited to: Inter-Integrated Circuit (I2C), Serial Peripheral Interface (SPI), Personal System 2 (PS/2), Universal Serial Bus (USB), Bluetooth®, Radio Frequency (RF), and Infrared Data Association (IrDA).

In FIG. 3, input device 300 is shown as a proximity sensor device (also often referred to as a "touchpad" or a "touch sensor device") configured to sense input provided by one or more input objects 340 in a sensing region 320. Example input objects include fingers and styli, as shown in FIG. 3.

Sensing region 320 encompasses any space above, around, in and/or near input device 300, in which input device 300 is able to detect user input (e.g., user input provided by one or more input objects 340). The sizes, shapes, and locations of particular sensing regions may vary widely from embodiment to embodiment. In some embodiments, sensing region 320 extends from a surface of input device 300 in one or more directions into space until signal-to-noise ratios prevent sufficiently accurate object detection. The distance to which this sensing region 320 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of input device 300, contact with an input surface (e.g., a touch surface) of input device 300, contact with an input surface of input device 300 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, sensing region 320 has a rectangular shape when projected onto an input surface of input device 300.

Input device 300 may utilize any combination of sensor components and sensing technologies to detect user input in sensing region 320. Input device 300 comprises one or more sensing elements for detecting user input. As a non-limiting example, input device 300 may use capacitive techniques.

Some implementations are configured to provide images that span one, two, three, or higher dimensional spaces. Some implementations are configured to provide projections of input along particular axes or planes.

In some capacitive implementations of input device 300, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Collectively transmitters and receivers may be referred to as sensor electrodes or sensor elements. Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive. In some embodiments, one or more receiver electrodes may be operated to receive a resulting signal when no transmitter electrodes are transmitting (e.g., the transmitters are disabled). In this manner, the resulting signal represents noise detected in the operating environment of sensing region 320.

In FIG. 3, a processing system 310 is shown as part of input device 300. Processing system 310 is configured to operate the hardware of input device 300 to detect input in sensing region 320. Processing system 310 comprises parts of or all of one or more integrated circuits (ICs) and/or other circuitry components. (For example, a processing system for a mutual capacitance sensor device may comprise a transmitter module configured to transmit signals with transmitter sensor electrodes, and/or a receiver module configured to receive signals with receiver sensor electrodes). In some embodiments, processing system 310 also comprises electronically-readable instructions, such as firmware code, software code, and/or the like. In some embodiments, components composing processing system 310 are located together, such as near sensing element(s) of input device 300. In other embodiments, components of processing system 310 are physically separate with one or more components close to sensing element(s) of input device 300, and one or more components elsewhere. For example, input device 300 may be a peripheral coupled to a desktop computer, and processing system 310 may comprise software configured to run on a central processing unit of the desktop computer and one or more ICs (perhaps with associated firmware) separate from the central processing unit. As another example, input device 300 may be physically integrated in a phone, and processing system 310 may comprise circuits and firmware that are part of a main processor of the phone. In some embodiments, processing system 310 is dedicated to implementing input device 300. In other embodiments, processing system 310 also performs other functions, such as operating display screens, driving haptic actuators, etc.

Processing system 310 may be implemented as a set of modules that handle different functions of processing system 310. Each module may comprise circuitry that is a part of processing system 310, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, processing system 310 responds to user input (or lack of user input) in sensing region 320 directly by causing one or more actions. Example actions include changing operation modes, as well as GUI actions such as cursor movement, selection, menu navigation, and other functions. In some embodiments, processing system 310 provides information about the input (or lack of input) to some part of the electronic system (e.g., to a central processing system of the electronic system that is separate from processing system 310, if such a separate central processing system exists). In some embodiments, some part of the electronic system processes information received from processing system 310 to act on user input, such as to facilitate a full range of actions, including mode changing actions and GUI actions.

For example, in some embodiments, processing system 310 operates the sensing element(s) of input device 300 to produce electrical signals indicative of input (or lack of input) in sensing region 320. Processing system 310 may perform any appropriate amount of processing on the electrical signals in producing the information provided to the electronic system. For example, processing system 310 may digitize analog electrical signals obtained from the sensor electrodes. As another example, processing system 310 may perform filtering or other signal conditioning. As yet another example, processing system 310 may subtract or otherwise account for a baseline, such that the information reflects a difference between the electrical signals and the baseline. As yet further examples, processing system 310 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, input device 300 is implemented with additional input components that are operated by processing system 310 or by some other processing system. These additional input components may provide redundant functionality for input in sensing region 320, or some other functionality. FIG. 3 shows buttons 330 near sensing region 320 that can be used to facilitate selection of items using input device 300. Other types of additional input components include sliders, balls, wheels, switches, and the like. Conversely, in some embodiments, input device 300 may be implemented with no other input components.

In some embodiments, input device 300 may be a touch screen, and sensing region 320 overlaps at least part of an active area of a display screen. For example, input device 300 may comprise substantially transparent sensor electrodes overlaying the display screen and provide a touch screen interface for the associated electronic system 350. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. Input device 300 and the display screen may share physical elements. For example, some embodiments may utilize some of the same electrical components for displaying and sensing. As another example, the display screen may be operated in part or in total by processing system 310.

It should be understood that while many embodiments are described in the context of a fully functioning apparatus, the mechanisms are capable of being distributed as a program product (e.g., software) in a variety of forms. For example, the mechanisms that are described may be implemented and distributed as a software program on information bearing media that are readable by electronic processors (e.g., non-transitory computer-readable and/or recordable/writable information bearing media readable by processing system 310). Additionally, the embodiments apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other tangible storage technology.

Example Sensor Electrode Pattern

Figure 4:
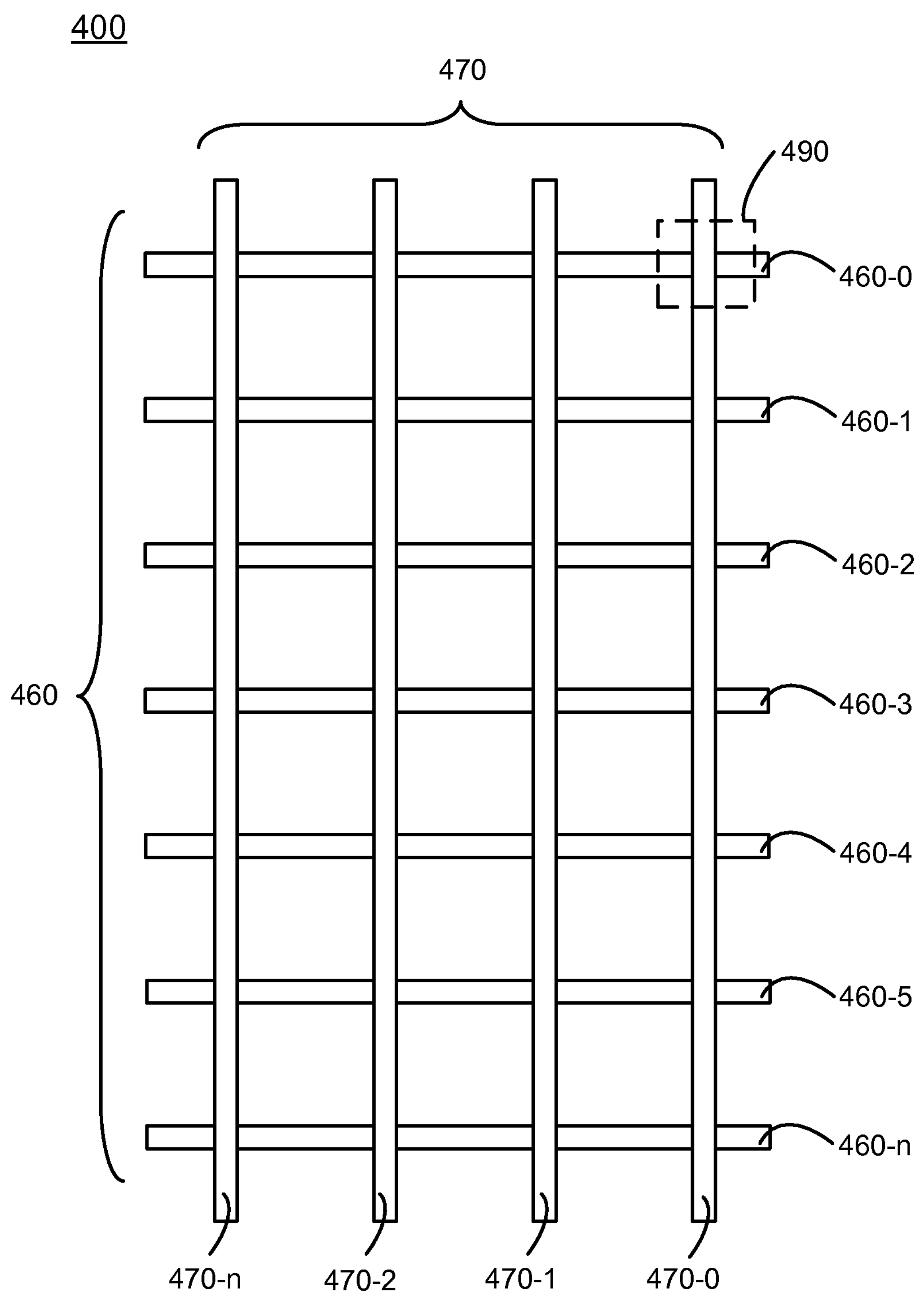
FIG. 4 shows a portion of an example sensor electrode pattern which may be utilized in a sensor to generate all or part of the sensing region of an input device, such as a touch screen, according to some embodiments.

FIG. 4 shows a portion of an example sensor electrode pattern 400 which may be utilized in a sensor to generate all or part of the sensing region of a input device 300, according to various embodiments. Input device 300 is configured as a capacitive input device when utilized with a capacitive sensor electrode pattern. For purposes of clarity of illustration and description, a non-limiting simple rectangular sensor electrode pattern 400 is illustrated. It is appreciated that numerous other sensor electrode patterns may be employed including patterns with a single set of sensor electrodes, patterns with two sets of sensor electrodes disposed in a single layer (without overlapping), and patterns that provide individual button electrodes. The illustrated sensor electrode pattern is made up of a plurality of receiver electrodes 470 (470-0, 470-1, 470-2 . . . 470-n) and a plurality of transmitter electrodes 460 (460-0, 460-1, 460-2 . . . 460-n) which overlay one another, in this example. In the illustrated example, touch sensing pixels are centered at locations where transmitter and receiver electrodes cross. Capacitive pixel 490 illustrates one of the capacitive pixels generated by sensor electrode pattern 400 during transcapacitive sensing. It is appreciated that in a crossing sensor electrode pattern, such as the illustrated example, some form of insulating material or substrate is typically disposed between transmitter electrodes 460 and receiver electrodes 470. However, in some embodiments, transmitter electrodes 460 and receiver electrodes 470 may be disposed on the same layer as one another through use of routing techniques and/or jumpers. In various embodiments, touch sensing includes sensing input objects anywhere in sensing region 320 and may comprise: no contact with any surfaces of the input device 300, contact with an input surface (e.g., a touch surface) of the input device 300, contact with an input surface of the input device 300 coupled with some amount of applied force or pressure, and/or a combination thereof.

When accomplishing transcapacitive measurements, capacitive pixels, such as capacitive pixel 490, are areas of localized capacitive coupling between transmitter electrodes 460 and receiver electrodes 470. The capacitive coupling between transmitter electrodes 460 and receiver electrodes 470 changes with the proximity and motion of input objects in the sensing region associated with transmitter electrodes 460 and receiver electrodes 470.

In some embodiments, sensor electrode pattern 400 is "scanned" to determine these capacitive couplings. That is, the transmitter electrodes 460 are driven to transmit transmitter signals. Transmitters may be operated such that one transmitter electrode transmits at one time, or multiple transmitter electrodes transmit at the same time. Where multiple transmitter electrodes transmit simultaneously, these multiple transmitter electrodes may transmit the same transmitter signal and produce an effectively larger transmitter electrode, or these multiple transmitter electrodes may transmit different transmitter signals. For example, multiple transmitter electrodes may transmit different transmitter signals according to one or more coding schemes that enable their combined effects on the resulting signals of receiver electrodes 470 to be independently determined The receiver electrodes 470 may be operated singly or multiply to acquire resulting signals. The resulting signals may be used to determine measurements of the capacitive couplings at the capacitive pixels.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

In some embodiments, one or more sensor electrodes 460 or 470 may be operated to perform absolute capacitive sensing at a particular instance of time. For example, receiver electrode 470-0 may be charged and then the capacitance of receiver electrode 470-0 may be measured. In such an embodiment, an input object 340 interacting with receiver electrode 470-0 alters the electric field near receiver electrode 470-0, thus changing the measured capacitive coupling. In this same manner, a plurality of sensor electrodes 470 may be used to measure absolute capacitance and/or a plurality of sensor electrodes 460 may be used to measure absolute capacitance. It should be appreciated that when performing absolute capacitance measurements the labels of "receiver electrode" and "transmitter electrode" lose the significance that they have in transcapacitive measurement techniques, and instead a sensor electrode 460 or 470 may simply be referred to as a "sensor electrode."

Example Processing System

Figure 5:
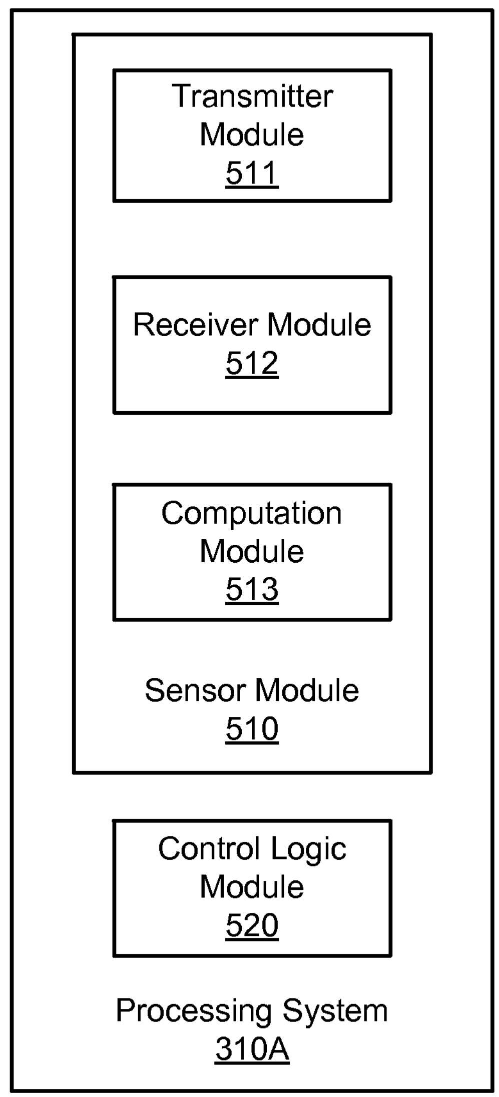
FIG. 5 shows a block diagram of a processing system for a capacitive charge measuring circuit, according to some embodiments.

FIG. 5 illustrates a block diagram of some components of an example processing system 310A that may be utilized with an input device (e.g., in place of processing system 310 as part of input device 300), according to various embodiments. Processing system 310A may be implemented with one or more Application Specific Integrated Circuits (ASICSs), one or more Integrated Circuits (ICs), one or more controllers, or some combination thereof. In one embodiment, processing system 310A is communicatively coupled with one or more transmitter electrode(s) and receiver electrode(s) that implement a sensing region 320 of an input device 300. In some embodiments, processing system 310A and the input device 300, of which it is a part, may be disposed in or communicatively coupled with an electronic system 350, such as a display device, computer, or other electronic system.

In one embodiment processing system 310A includes, among other components: sensor module 510, and control logic module 520. Processing system 310A and/or components thereof may be coupled with sensor electrodes of a sensor electrode pattern, such as sensor electrode pattern 400. For example, sensor module 510 is coupled with one or more sensor electrodes of a sensor electrode pattern (e.g., sensor electrode pattern 400) of input device 300.

Sensor module 510 operates to interact with receiver and/or transmitter sensor electrodes of a sensor pattern that is utilized to generate a sensing region 320. This includes operating transmitter electrodes to be silent or transmit a transmitter signal, to be used for transcapacitive sensing, or to be used for absolute capacitive sensing. This includes operating receiver electrodes for transcapacitive sensing or absolute capacitive sensing. This also includes utilizing receiver sensor electrodes to receive resulting signals and other signals which may be interference. Sensor module 510 may also determine from received resulting signal(s) that an input has occurred in sensing region 320, as well as determining a location of the input with respect to sensing region 320. Sensor module 510 may further determine that interference is occurring and/or determine the nature of the interference. As depicted in FIG. 5, sensor module 510 may include one or more of transmitter module 511, receiver module 512, and computation module 513.

Transmitter module 511 operates to transmit transmitter signals on one or more transmitter electrodes 460. In a given time interval, transmitter module 511 may transmit or not transmit a transmitter signal (waveform) on one or more of a plurality of transmitter electrodes 460. Transmitter module 511 may also be utilized to couple one or more transmitter electrodes 460 (and respective transmitter path(s)) of a plurality of transmitter electrodes 460) to high impedance, ground, or to a constant voltage when not transmitting a waveform on such transmitter electrodes. The transmitter signal may be a square wave, trapezoidal wave, or some other waveform. Transmitter module 511 may code a transmitter signal, such as in a code division multiplexing scheme. The code may be altered, such as lengthening or shortening the code, under direction of control logic module 520. Lengthening the code is one technique for avoiding interference.

Receiver module 512 operates to receive resulting signals, via receiver electrodes during transcapacitive sensing. The received resulting signals correspond to and include some version of the transmitter signal(s) transmitted via the transmitter electrodes. These transmitted transmitter signals however, may be altered or changed in the resulting signal due to stray capacitance, noise, interference, and/or circuit imperfections among other factors, and thus may differ slightly or greatly from their transmitted versions. Receiver module 512 also operates to receive resulting signals from receiver and/or transmitter electrodes when operating absolute capacitive sensing is performed. To avoid interference, receiver module 512 may be equipped to implement one or more filtering operations, which may include utilizing either or both of linear and non-linear filtering techniques. As will be further described herein, filtering operations may be implemented, not implemented, and/or modified under direction of control logic module 520. Resulting signals may be received on one or a plurality of sensor electrodes during a time interval. Receiver module 512 includes a plurality of amplifiers, typically one per receiver electrode. Such amplifiers may be referred to herein as amplifiers, front-end amplifiers, integrating amplifiers, or the like, and receive a reference voltage at a first input and a resulting signal at a second input. The resulting signal is from a receiver electrode of a capacitive sensor device.

Computation module 513 operates to compute/determine a measurement of a change in a transcapacitive capacitive coupling between a transmitter electrode and a receiver electrode during transcapacitive sensing. Computation module 513 also operates to compute/determine a measurement of absolute capacitive coupling to a sensor electrode (either a receiver electrode or a transmitter electrode). Computation module 513 then uses such measurements to determine the position of an input object (if any) with respect to sensing region 320.

Control logic module 520 comprises decision making logic which directs processing system 310A and sensor module 510 to operate in a selected one of a plurality of different operating modes based on various inputs. Some non-limiting examples of such modes: include normal power mode; low power mode (where less power is used for sensing than in the normal power mode); transcapacitive sensing mode; and absolute capacitive sensing mode. Some non-limiting examples of such inputs include one or more measurement(s) of interference and/or indication of an input being sensed or not sensed in sensing region 320 of input device 300. Control logic of control logic module 520 may be implemented as hardware (e.g., hardware logic and/or other circuitry) and/or as a combination of hardware and instructions stored in a non-transitory manner in a computer readable storage medium.

Example Uses in Input Devices

Figure 6:
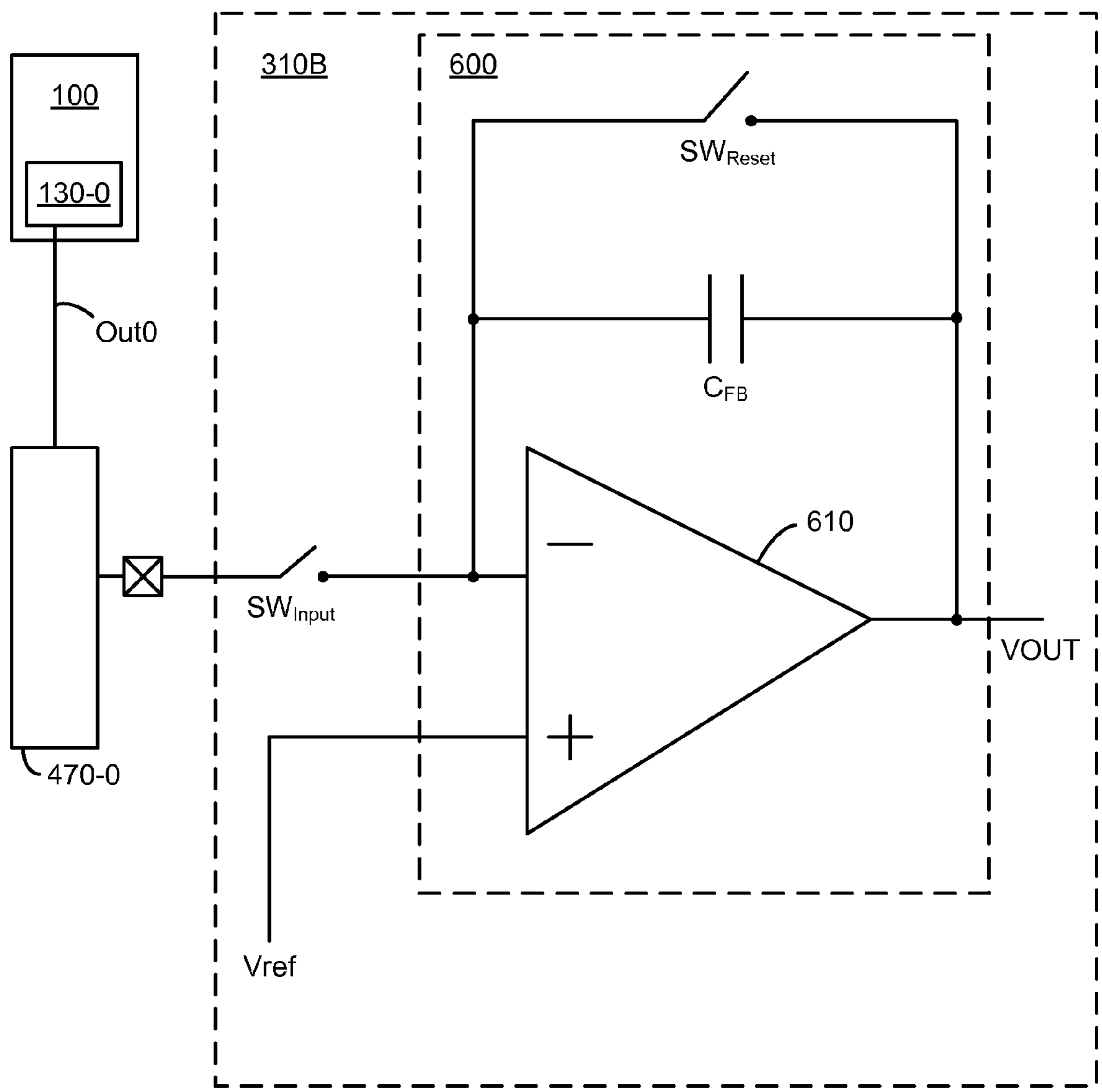
FIG. 6 illustrates an input device, according to an embodiment.

FIG. 6 illustrates an input device 300B, according to an embodiment. Input device 300B includes at least one sensor electrode (depicted as receiver electrode 470-0), a charge distributor 100, a processing system 310B, and a charge integrator 600. Charge integrator 600 includes a differential amplifier 610 with a feedback capacitor $C_{FB}$ connected across its inverting input and its output and a reset switch $SW_{Reset}$ disposed in parallel with $C_{FB}$. A reference voltage, Vref is coupled with the non-inverting input of differential amplifier 610. The inverting input of differential amplifier 610 is coupled with sensor electrode 470-0 through switch $SW_{Input}$. When $SW_{Reset}$ is open and $SW_{Input}$ is closed, amplifier 610 integrates any charge on receiver electrode 470-0 to produce output voltage VOUT. As depicted, output stage 130-0 is coupled with sensor electrode 470-0 and can supply a charge to sensor electrode 470-0 which adds to or subtracts from charge on sensor electrode 470-0.

Figure 7:
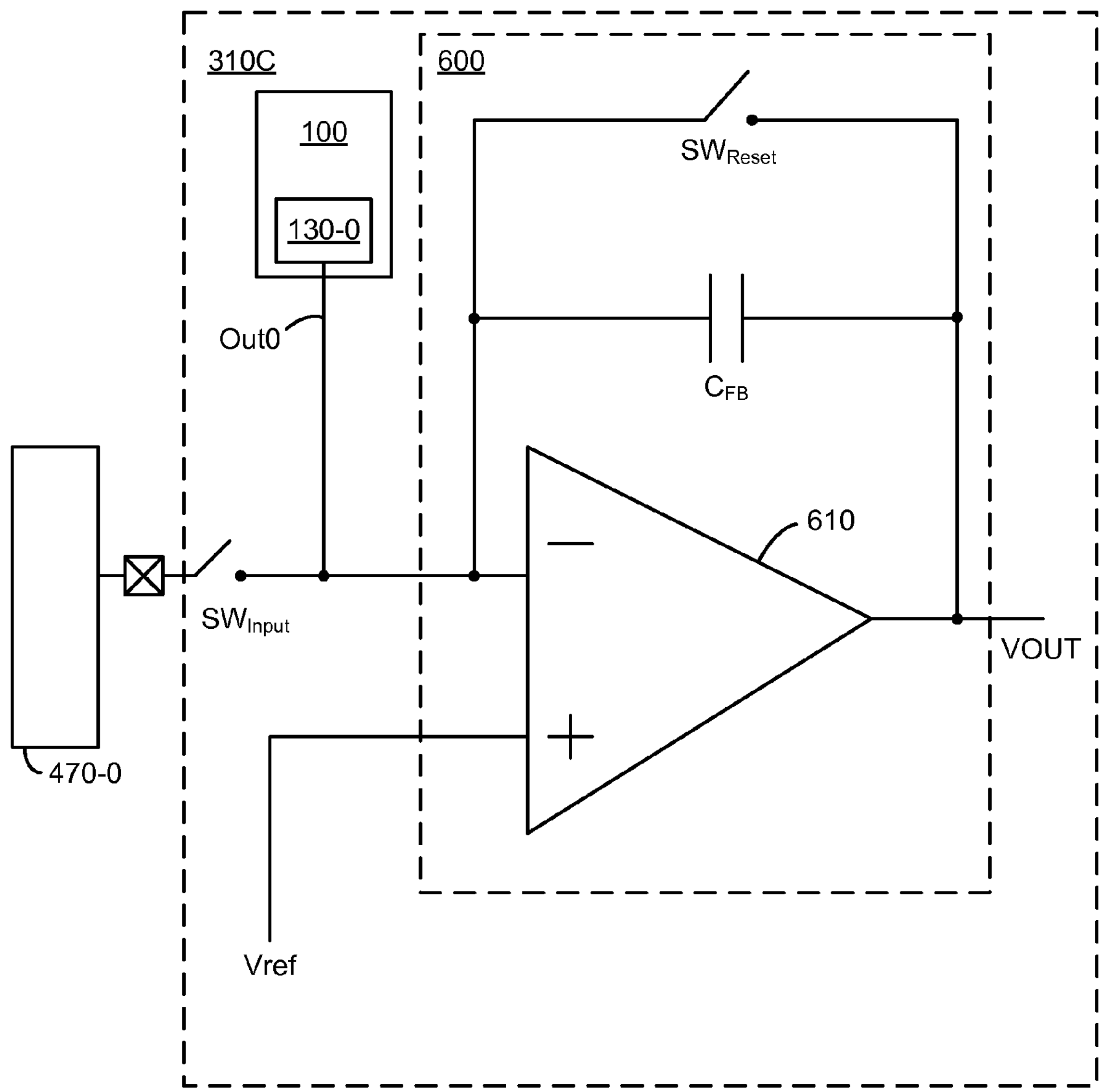
FIG. 7 illustrates an input device, according to an embodiment.

FIG. 7 illustrates an input device 300C, according to an embodiment. Input device 300C includes at least one sensor electrode (depicted as receiver electrode 470-0), a charge distributor 100, a processing system 310C, and a charge integrator 600. Charge integrator 600 includes a differential amplifier 610 with a feedback capacitor $C_{FB}$ connected across its inverting input and its output and a reset switch $SW_{Reset}$ disposed in parallel with CFB. A reference voltage, Vref is coupled with the non-inverting input of differential amplifier 610. The inverting input of differential amplifier 610 is coupled with sensor electrode 470-0 through switch $SW_{Input}$. When $SW_{Reset}$ is open and $SW_{Input}$ is closed, amplifier 610 integrates any charge on receiver electrode 470-0 to produce output voltage VOUT. As depicted, output stage 130-0 is coupled with the non-inverting input of amplifier 610 and can supply a charge, Out0 , to sensor electrode 470-0. In one embodiment, charge Out0 subtracts from or offsets charge received from sensor electrode 470-0. This charge subtraction or offset can be used to increase the dynamic range of amplifier 610. As previously described, the value of Out0 may be varied in some embodiments. In one embodiment, processing system 310C controls when and whether charge Out0 is supplied and what value is supplied. For example, in one embodiment, processing system 310C can control the amount of charge Out0 such that an appropriate amount of charge is subtracted at the non-inverting input of amplifier 610 so that saturation of amplifier 610 is prevented. In one embodiment, processing system 310C can control the amount of charge Out0 such that an appropriate amount of charge is subtracted at the non-inverting input of amplifier 610 so that a very small input may be more greatly amplified by amplifier 610.

The examples set forth herein were presented in order to best explain, to describe particular applications, and to thereby enable those skilled in the art to make and use embodiments of the described examples. However, those skilled in the art will recognize that the foregoing description and examples have been presented for the purposes of illustration and example only. The description as set forth is not intended to be exhaustive or to limit the embodiments to the precise form disclosed.

What is claimed is:

1. A processing system for an input device comprising:

a receiver module comprising a first charge integrator coupled to a first sensor electrode and configured to integrate a charge on said first sensor electrode; and a charge distributor comprising:

a current conveyor; and a plurality of output stages coupled to the current conveyor, wherein a first output stage of the plurality of output stages comprises a plurality of current mirrors and is configured to output a first scaled mirrored charge to offset said charge integrated by said first charge integrator, wherein said first scaled mirrored charge is based on a charge signal provided via said current conveyor.

2. The processing system of claim 1, wherein offsetting charge integrated by said first charge integrator comprises subtracting charge from the sensor electrode.

3. The processing system of claim 1, wherein offsetting charge integrated by said first charge integrator comprises adding charge to the sensor electrode.

4. The processing system of claim 1, wherein the first output stage is coupled to said first sensor electrode.

5. The processing system of claim 1, wherein the charge distributor further comprises a charge generator configured to output said charge signal to said current conveyor.

6. The processing system of claim 1, wherein said first scaled mirrored charge is variable and is configured to prevent saturation of said first charge integrator.

7. The processing system of claim 1, wherein scaling of said first scaled mirrored charge comprises:

variable scaling.

8. The processing system of claim 1, wherein scaling of said first scaled mirrored charge comprises:

fixed scaling.

9. The processing system of claim 1 further comprising a transmitter module configured to drive a transmitter signal on a second sensor electrode, and wherein said first sensor electrode is capacitively coupled with said second sensor electrode.

10. An input device comprising:

a plurality of sensor electrodes; and a processing system coupled to said plurality of sensor electrode and configured to:

receive a resulting signal with a first sensor electrode of said plurality of sensor electrodes, wherein said resulting signal corresponds to a charge on said first sensor electrode offset by an output charge supplied by an output stage of a charge distributor comprising a current conveyor; and determine position of an input object with respect to a sensing region of said input device based on said resulting signal.

11. The input device of claim 10, wherein processing system is further configured to transmit a transmitter signal with a second sensor electrode of said plurality of sensor electrode, wherein said resulting signal comprises effects corresponding to said transmitter signal.

12. The input device of claim 10, wherein processing system is further configured to drive said first sensor electrode with a modulated signal, wherein said resulting signal comprises effects corresponding to said modulated signal.

13. The input device of claim 10, wherein offsetting said charge comprises subtracting charge from the sensor electrode.

14. The input device of claim 10, wherein offsetting said charge comprises adding charge to the sensor electrode.

15. The input device of claim 10, wherein said output stage comprises a plurality of current mirrors configured to scale and mirror a charge signal provided by said current conveyor.

16. The input device of claim 15 wherein said scaling is variable.

17. The input device of claim 15, wherein said offsetting by an output charge is variable.

18. A method for charge offsetting, said method comprising:

integrating charge on a first sensor electrode with a charge integrator; and supplying an output charge from a first output stage of a charge distributor to offset said charge on said first sensor electrode, wherein said first output stage is coupled to a current conveyor and comprises a plurality of current mirrors, the plurality of current mirrors are configured to scale and mirror a charge signal received from said current conveyor to generate said output charge.

19. The method of claim 18 wherein offsetting said charge on said first sensor electrode comprises subtracting charge from the sensor electrode.

20. The method of claim 18 wherein offsetting said charge on said first sensor electrode comprises adding charge to the sensor electrode.

* * * * *